United States Patent [19]
Partlo

[11] Patent Number: 6,051,841
[45] Date of Patent: *Apr. 18, 2000

[54] PLASMA FOCUS HIGH ENERGY PHOTON SOURCE

[75] Inventor: William N. Partlo, San Diego, Calif.

[73] Assignee: Cymer, Inc., San Diego, Calif.

[*] Notice: This patent is subject to a terminal disclaimer.

[21] Appl. No.: 09/093,416

[22] Filed: Jun. 8, 1998

Related U.S. Application Data

[63] Continuation-in-part of application No. 08/854,507, May 12, 1997, Pat. No. 5,763,930.

[51] Int. Cl.⁷ ..................................................... H01J 35/20
[52] U.S. Cl. ................................ 250/504 R; 250/493.1; 378/119
[58] Field of Search ............................. 50/504 R, 493.1; 378/119

[56] References Cited

U.S. PATENT DOCUMENTS

| | | | |
|---|---|---|---|
| 3,150,483 | 9/1964 | Mayfield et al. | 60/35.5 |
| 3,232,046 | 2/1966 | Meyer | 60/35.5 |
| 3,279,176 | 10/1966 | Boden | 60/202 |
| 3,961,197 | 6/1976 | Dawson | 250/493 |
| 3,969,628 | 7/1976 | Roberts et al. | 250/402 |
| 4,042,848 | 8/1977 | Lee | 313/231.6 |
| 4,143,275 | 3/1979 | Mallozzi et al. | 250/503 |
| 4,203,393 | 5/1980 | Giardini | 123/30 |
| 4,364,342 | 12/1982 | Asik | 123/143 B |
| 4,369,758 | 1/1983 | Endo | 123/620 |
| 4,504,964 | 3/1985 | Cartz et al. | 378/119 |
| 4,507,588 | 3/1985 | Asmussen et al. | 315/39 |
| 4,536,884 | 8/1985 | Weiss et al. | 378/119 |
| 4,538,291 | 8/1985 | Iwamatsu | 378/119 |
| 4,561,406 | 12/1985 | Ward | 123/536 |
| 4,618,971 | 10/1986 | Weiss et al. | 378/34 |
| 4,633,492 | 12/1986 | Weiss et al. | 378/119 |
| 4,635,282 | 1/1987 | Okada et al. | 378/34 |
| 4,751,723 | 6/1988 | Gupta et al. | 378/119 |
| 4,752,946 | 6/1988 | Gupta et al. | 378/119 |
| 4,774,914 | 10/1988 | Ward | 123/162 |
| 4,837,794 | 6/1989 | Riordan et al. | 378/119 |
| 5,023,897 | 6/1991 | Neff et al. | 378/122 |
| 5,102,776 | 4/1992 | Hammer et al. | 430/311 |
| 5,142,166 | 8/1992 | Birx | 307/419 |
| 5,175,755 | 12/1992 | Kumakhov | 378/34 |
| 5,241,244 | 8/1993 | Cirri | 315/111.41 |
| 5,442,910 | 8/1995 | Anderson | 60/266 |
| 5,499,282 | 3/1996 | Silfvast | 378/119 |
| 5,504,795 | 4/1996 | McGeoch | 378/119 |
| 5,763,930 | 6/1998 | Partlo | 250/504 R |
| 5,866,871 | 2/1999 | Birx | 219/121.48 |

OTHER PUBLICATIONS

Bailey et al. "Evaluation of the gas puff z pinch as an x–ray lithography and microscopy source," *Appl. Phys. Lett.,* 40(1), Jan. 1, 1982, pp. 33–35.

(List continued on next page.)

*Primary Examiner*—Jack Berman
*Attorney, Agent, or Firm*—John R. Ross, Esq.

[57] ABSTRACT

A high energy photon source. A pair of plasma pinch electrodes are located in a vacuum chamber. A working gas which includes a noble buffer gas and an active gas chosen to provide a desired spectral line. A pulse power source provides electrical pulses at voltages high enough to create electrical discharge between the electrodes to produce very high temperature, high density plasma pinch in the working gas providing radiation at the spectral line of the active gas. An external reflection radiation collector-director collects radiation produced in the plasma pinches and directs the radiation in a desired direction. In a preferred embodiment the active gas is lithium and the buffer gas is helium and the radiation-collector is coated with the material used for the electrodes. A good choice for the material is tungsten. In a second preferred embodiment the buffer gas is argon and lithium gas is produced by vaporization of solid lithium located in a hole along the axis of the central electrode of a coaxial electrode configuration.

20 Claims, 3 Drawing Sheets

OTHER PUBLICATIONS

Choi et al., "Temporal development of hard and soft x–ray emission from a gas–puff Z pinch," *Rev. Sci. Instrum.,* 57(8), Aug. 1986, pp. 2162–2164.

Giordano and Letardi, "Magnetic pulse compressor for prepulse discharge in spiker–sustainer excitation technique for XeCl lasers," *Rev. Sci. Instrum.,* 65(8), Aug. 1994, pp. 247–2481.

Jahn, *Physics of Electric Propulsion* (New York: McGraw–Hill 1968) pp. 257–325.

Lowe, "Gas plasmas yield X rays for lithography," *Electronics,* Jan. 27, 1982, pp. 40–41.

Mather, "Formation of a High–Density Deuterium Plasma Focus," *The Physics of Fluids,* 8(2), Feb. 1965, pp. 366–377.

Matthews and Cooper, "Plasma sources for x–ray lithography" SPIE 333 Submicron Lithography, 1982, pp. 136–139.

Pearlman and Riordan, "X–ray lithography using a pulsed plasma source," *J. Vac. Sci. Technol.,* 19(4), Nov./Dec. 1981, pp. 1190–1193.

Shiloh et al., "Z Pinch of a Gas Jet," *The American Physical Society,* 40(8), 1978, pp. 515–518.

Stallings et al., "Imploding argon plasma experiments," *Appl. Phys. Lett.,* 35(7), Oct. 1, 1979, pp. 524–526.

PLASMA FOCUS HIGH ENERGY PHOTON SOURCE

This application is a continuation-in-part of U.S. Ser. No. 08/854,507, filed May 12, 1997 now U.S. Pat. No. 5,763, 930. This invention relates to high energy photon sources and in particular highly reliable x-ray and high energy ultraviolet sources.

BACKGROUND OF THE INVENTION

The semiconductor industry continues to develop lithographic technologies which can print ever smaller integrated circuit dimensions. These systems must have high reliability, cost effective throughput, and reasonable process latitude. The integrated circuit fabrication industry is presently changing over from mercury G-line (436 nm) and I-line (365 nm) exposure sources to 248 nm and 193 nm excimer laser sources. This transition was precipitated by the need for higher lithographic resolution with minimum loss in depth-of-focus.

The demands of the integrated circuit industry will soon exceed the resolution capabilities of 193 nm exposure sources, thus creating a need for a reliable exposure source at a wavelength significantly shorter than 193 nm. An excimer line exists at 157 nm, but optical materials with sufficient transmission at this wavelength are unavailable. Therefore, all-reflective imaging systems must be used. An all reflective optical system requires a smaller numerical aperture than the transmissive systems. The loss in resolution caused by the smaller NA can only be made up by reducing the wavelength by a large factor. Thus, a light source in the range of 10 nm is required if the resolution of optical lithography is to be improved beyond that achieved with 193 nm.

The present state of the art in high energy ultraviolet and x-ray sources utilizes plasmas produced by bombarding various target materials with laser beams, electrons or other particles. Solid targets have been used, but the debris created by ablation of the solid target has detrimental effects on various components of a system intended for production line operation. A proposed solution to the debris problem is to use a frozen liquid or frozen gas target so that the debris will not plate out onto the optical equipment. However, none of these systems have proven to be practical for production line operation.

It has been well known for many years that x-rays and high energy ultraviolet radiation could be produced in a plasma pinch operation. In a plasma pinch an electric current is passed through a plasma in one of several possible configuration such that the magnetic field created by the flowing electric current accelerates the electrons and ions in the plasma into a tiny volume with sufficient energy to cause substantial stripping of inner electrons from the ions and a consequent production of x-rays and high energy ultraviolet radiation. Various prior art techniques for generation of high energy radiation from focusing or pinching plasmas are described in the following patents:

J. M. Dawson, "X-Ray Generator," U.S. Pat. No. 3,961, 197, Jun. 1, 1976.

T. G. Roberts, et. al., "Intense, Energetic Electron Beam Assisted X-Ray Generator," U.S. Pat. No. 3,969,628, Jul. 13, 1976.

J. H. Lee, "Hypocycloidal Pinch Device," U.S. Pat. No. 4,042,848, Aug. 16, 1977.

L. Cartz, et. al., "Laser Beam Plasma Pinch X-Ray System," U.S. Pat. No. 4,504,964, Mar. 12, 1985.

A. Weiss, et. al., "Plasma Pinch X-Ray Apparatus," U.S. Pat. No. 4,536,884, Aug. 20, 1985.

S. Iwamatsu, "X-Ray Source," U.S. Pat. No. 4,538,291, Aug. 27, 1985.

A. Weiss, et. al, "X-Ray Lithography System," U.S. Pat. No. 4,618,971, Oct. 21, 1986.

A. Weiss, et. al., "Plasma Pinch X-ray Method," U.S. Pat. No. 4,633,492, Dec. 30, 1986.

I. Okada, Y. Saitoh, "X-Ray Source and X-Ray Lithography Method," U.S. Pat. No. 4,635,282, Jan. 6, 1987.

R. P. Gupta, et. al., "Multiple Vacuum Arc Derived Plasma Pinch X-Ray Source," U.S. Pat. No. 4,751,723, Jun. 14, 1988.

R. P. Gupta, et. al., "Gas Discharge Derived Annular Plasma Pinch X-Ray Source," U.S. Pat. No. 4,752,946, Jun. 21, 1988.

J. C. Riordan, J. S. Peariman, "Filter Apparatus for use with an X-Ray Source," U.S. Pat. No. 4,837,794, Jun. 6, 1989.

D. A. Hammer, D. H. Kalantar, "Method and Apparatus for Microlithography Using X-Pinch X-Ray Source," U.S. Pat. No. 5,102,776, Apr. 7, 1992.

M. W. McGeoch, "Plasma X-Ray Source," U.S. Pat. No. 5,504,795, Apr. 2, 1996.

What is needed is a production line reliable, simple system for producing high energy ultraviolet and x-radiation which avoids prior art problems associated with debris formation.

SUMMARY OF THE INVENTION

The present invention provides a high energy photon source. A pair of plasma pinch electrodes are located in a vacuum chamber. A working gas which includes a noble buffer gas and an active gas chosen to provide a desired spectral line. A pulse power source provides electrical pulses at voltages high enough to create electrical discharge between the electrodes to produce very high temperature, high density plasma pinch in the working gas providing radiation at the spectral line of the active gas. An external reflection radiation collector-director collects radiation produced in the plasma pinches and directs the radiation in a desired direction. In a preferred embodiment the active gas is lithium and the buffer gas is helium and the radiation-collector is coated with the material used for the electrodes. A good choice for the material is tungsten. In a second preferred embodiment the buffer gas is argon and lithium gas is produced by vaporization of solid lithium located in a hole along the axis of the central electrode of a coaxial electrode configuration.

DETAILED DESCRIPTION OF PREFERRED EMBODIMENTS

First Preferred Embodiment

Figure 1:
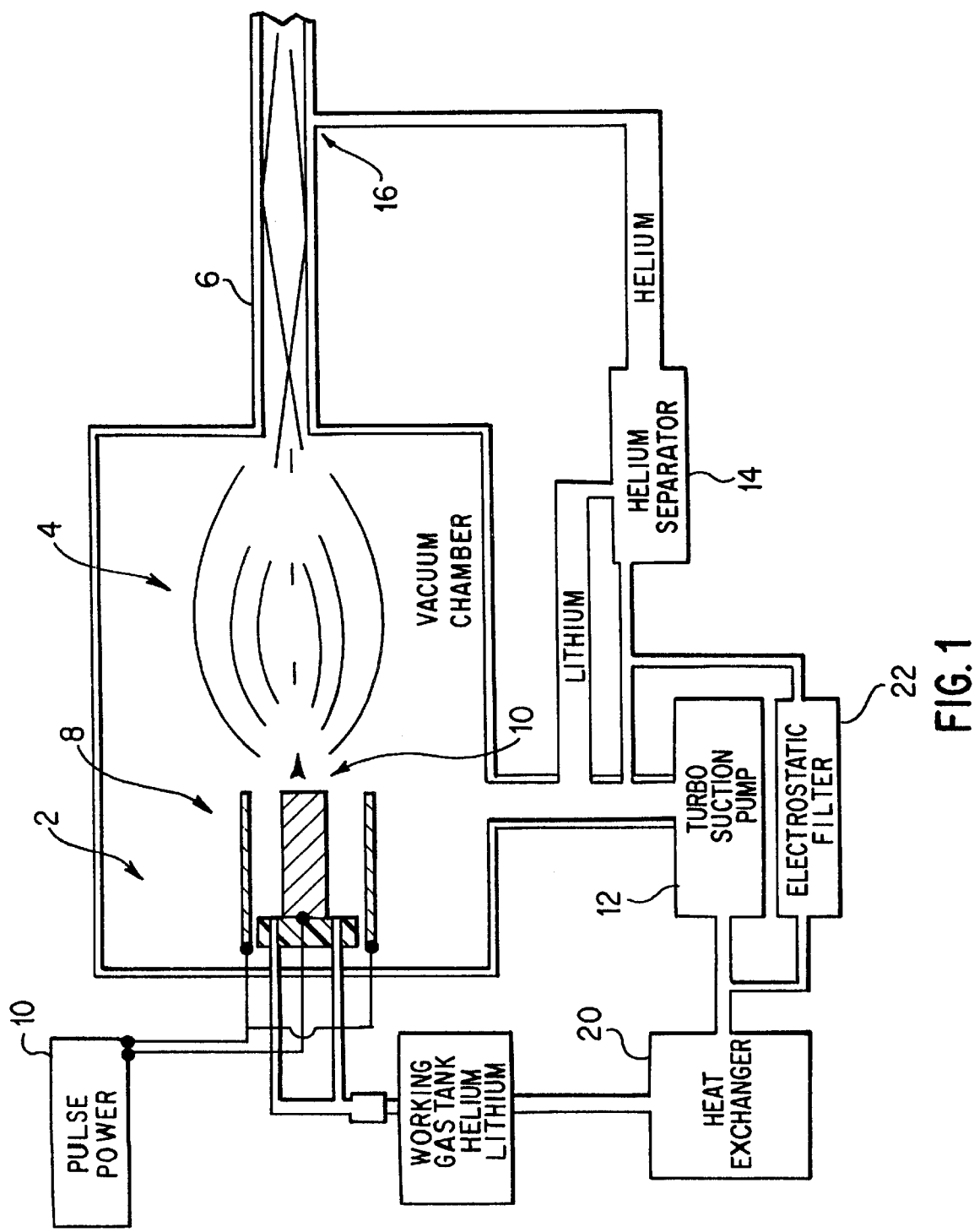
FIG. 1 is a drawing of a high energy photon source utilizing a preferred embodiment of the present invention.

A simplified drawing of high energy ultraviolet light source is shown in FIG. 1. The major components are a plasma pinch unit 2, a high energy photon collector 4 and a hollow light pipe 6. The plasma pinch source comprises a coaxial electrode 8 powered by a low inductance pulse power circuit 10. The pulse power circuit in this preferred embodiment is a high voltage, energy efficient circuit capable of providing 100 ns to 500 ns pulses in the range of 1 kV to 2 kV to coaxial electrode 8 at a rate of 1,000 Hz.

A small amount of working gas, such as a mixture of helium and lithium vapor, is present near the base of the electrode 8 as shown in FIG. 1. At each high voltage pulse, avalanche breakdown occurs between the inner and outer electrodes of coaxial electrode 8 either due to self breakdown. The avalanche process occurring in the buffer gas ionizes the gas and creates a conducting plasma between the electrodes at the base of the electrodes. Once a conducting plasma exists, current flows between the inner and outer electrodes. In this preferred embodiment, the outer electrode is at high voltage and inner electrode is at ground potential. Current will flow from the outer electrode to the inner electrode and thus electrons will flow away from the center and ions will flow toward the center. This current flow generates a magnetic field which acts upon the moving charge carriers accelerating them away from the base of the coaxial electrode 8.

When the plasma reaches the end of the center electrode, the electrical and magnetic forces on the plasma, pinch the plasma to a "focus" around a point 10 along the centerline of and a short distance beyond the end of the central electrode and the pressure and temperature of the plasma rise rapidly reaching extremely high temperatures, in come cases as high as the temperature at the surface of the sun! The dimensions of the electrodes and the total electrical energy in the circuit are preferably optimized to produce the desired black body temperature in the plasma. For the production of radiation in the 13 nm range a black body temperature of about 100 eV is required. In general, for a particular coaxial configuration, temperature will increase with increasing voltage of the electrical pulse. The shape of the radiation spot is somewhat irregular in the axial direction and roughly gausian in the radial direction. The about 95 percent of the energy irradiated is from a volume with a radius of about 1 mm.

In most prior art plasma pinch units described in the technical literature, the radiation spot emits radiation in all directions with a spectrum closely approximating a black body. The purpose of the lithium in the working gas is to narrow the spectrum of the radiation from the radiation spot.

Lithium Vapor

Doubly ionized lithium exhibits an electronic transition at 13 nm and serves as the radiation source atom in the buffer of helium. Doubly ionized lithium is an excellent choice for two reasons. The first is the low melting point and high vapor pressure of lithium. The lithium ejected from the radiation spot can be kept from plating out onto the chamber walls and collection optics by simply heating these surfaces to 50–100° C. The vapor phase lithium can then be pumped from the chamber along with the helium buffer gas using standard turbo-molecular pumping technology. And the lithium can be easily separated from the helium merely by cooling the two gases.

The second advantage of using lithium as the source atom is that non-ionized lithium has a low absorption cross section for 13 nm radiation. Any ionized lithium ejected from the radiation spot can be easily swept away with a moderate electric field. The remaining non-ionized lithium is essentially transparent to 13 nm radiation. The currently most popular proposed 13 nm source makes use of a laser ablated frozen jet of xenon. Such a system must capture virtually all of the ejected xenon before the next pulse because the absorption cross section for xenon at 13 nm is large.

Radiation Collector

The radiation produced at the radiation spot is emitted uniformly into a full 4Π steradians. Some type of collection optics is needed to capture this radiation and direct it toward the lithography tool. Previously proposed 13 nm light sources suggested collection optics based on the use of multi-layer dielectric coated mirrors. The use of multi-layer dielectric mirrors is used to achieve high collection efficiency over a large angular range. Any radiation source which produced debris would coat these dielectric mirrors and degrade their reflectivity, and thus reduce the collected output from the source. This preferred system will suffer from electrode erosion and thus would, over time, degrade any dielectric mirror placed in proximity to the radiation spot.

Thus our choice of a radiation collector is to utilize a technique previously developed for collection of hard x-ray radiation. This technique exploits the fact that many materials have an index of refraction having a real component less than unity in the x-ray region. Total reflection can be achieved at angles were Snell's law dictates that the refracted angle inside the reflector material would be greater than 90°. Some materials such as tungsten exhibit total external reflection up to 18° from grazing incidence at 13 nm.

To produce a collector capable of accepting a large cone angle, several conical sections can be nested inside each other. Each conical section may employ more than one reflection of the radiation to redirect its section of the radiation cone in the desired direction. Designing the collection for operation nearest to grazing incidence will produce a collector most tolerant to deposition of eroded electrode material. The grazing incidence reflectivity of mirrors such as this depends strongly on the mirror's surface roughness. The dependence on surface roughness decreases as the incident angle approaches grazing incidence. We estimate that we can collect and direct the 13 nm radiation being emitted over a solid angle of least 25 degrees.

Tungsten Electrodes—Tungsten Coatings for Collector

In choosing the material for the total external reflection collector, it is preferred that the coating material on the collector be the same as the electrode material. Tungsten is a promising candidate since it has demonstrated performance as an electrode and the real part of its refractive index at 13 nm is 0.945. Using the same material for the electrode and the mirror coating eliminates the degradation of mirror reflectivity as the eroded electrode material plates out onto the collection mirror.

Silver Electrodes and Coatings

Silver is also an excellent choice for the electrodes and the coatings because it also has a low refractive index at 13 nm and has high thermal conductivity allowing higher repetition rate operation.

Light Pipe

It is important to keep deposition materials away from the illumination optics of the lithography tool. Therefore, a light pipe 6 is preferred to further assure this separation. The lightpipe 6 is a hollow lightpipe which also employs substantially total external reflection on its inside surfaces. The primary collection optic can be designed to reduce the cone angle of the collected radiation to match the acceptance angle of the hollow lightpipe. This concept is shown in FIG. 1.

The dielectric mirrors of the lithography tool would then be very well protected from any electrode debris since a tungsten, silver or lithium atom would have to diffuse upstream against a flow of buffer gas down the hollow lightpipe as shown in FIG. 1.

Pulse Power Unit

The preferred pulse power unit 10 is a solid state high frequency, high voltage pulse power unit utilizing a solid state trigger and a magnetic switch circuit such as the pulse power units described in U.S. Pat. No. 5,142,166. These units are extremely reliable and can operate continuously without substantial maintenance for many months and billions of pulses. The teachings of U.S. Pat. No. 5,142,166 are incorporated herein by reference.

The System—First Preferred Embodiment

Thus, as shown in FIG. 1, in a first preferred embodiment, a working gas mixture of helium and lithium vapor at a temperature of about 90 degrees C. is discharged into coaxial electrode 8. Electrical pulses from pulse power unit 10 create a dense plasma focus at 10 at sufficiently high temperatures and pressures to doubly ionize the lithium atoms in the working gas generating ultraviolet radiation at about 13 nm wavelength.

This light is collected in total external reflection collector 4 and directed into hollow light pipe 6 where the light is further directed to a lithography tool (not shown). Discharge chamber 1 is maintained at a vacuum of about 4 Torr with turbo suction pump 12. Some of the helium in the working gas is separated in helium separator 14 and used to purge the lightpipe as shown in FIG. 1 at 16. The pressure of helium in the light pipe is preferably matched to the pressure requirements of the lithography tool which typically is maintained at a low pressure or vacuum. The temperature of the working gas is maintained at the desired temperature with heat exchanger 20 and the gas is cleaned with electrostatic filter 22. The gas is discharged into the coaxial electrode space as shown in FIG. 1.

Second Preferred Plasma Pinch Unit

Figure 2:
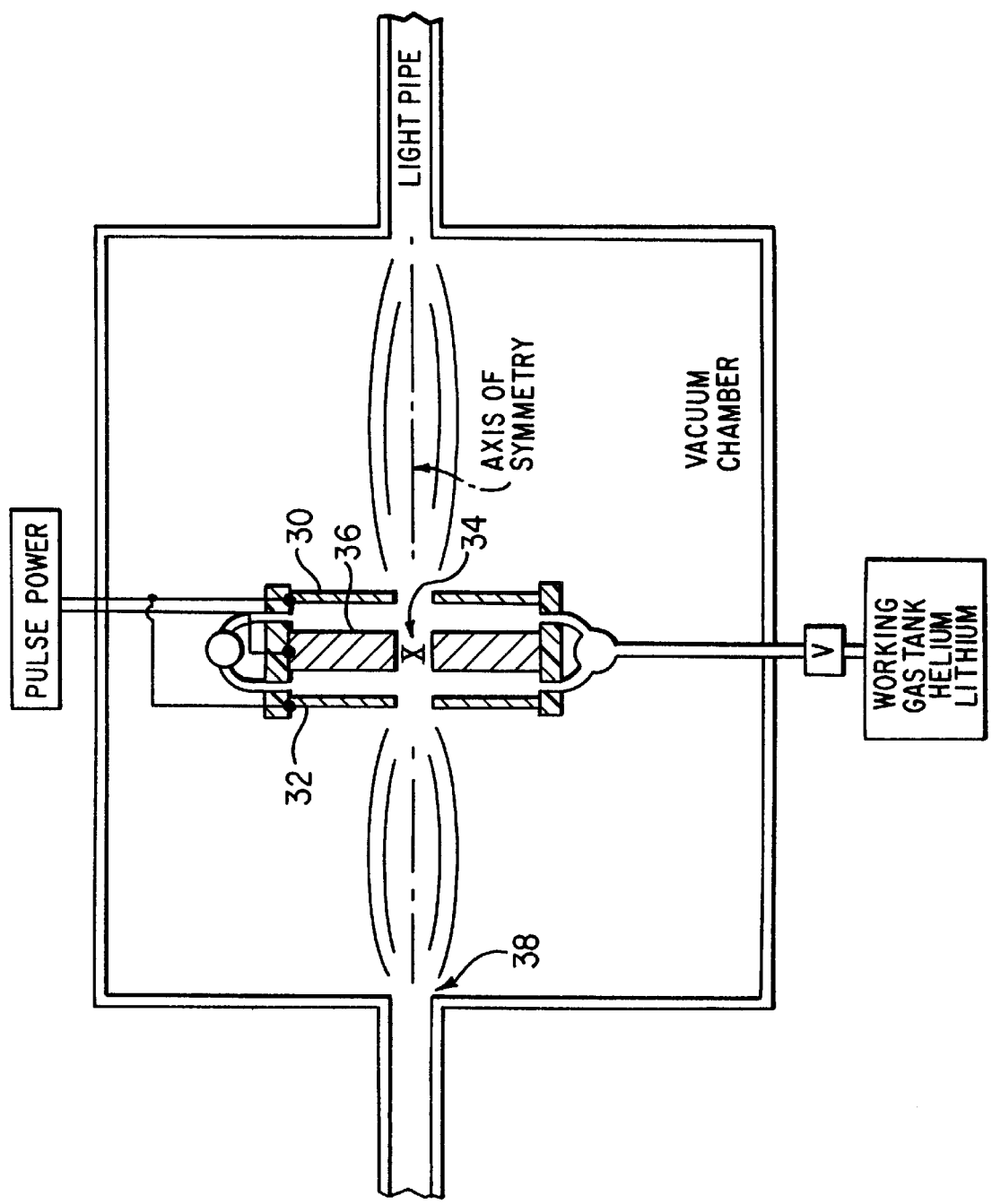
FIG. 2 is a drawing of a three dimensional plasma pinch device with disk shaped electrodes.

A second preferred plasma pinch unit is shown in FIG. 2. This unit is similar to the plasma pinch device described in U.S. Pat. No. 4,042,848. This unit comprises two outer disk shaped electrodes 30 and 32 and an inner disk shaped electrode 36. The pinch is created from three directions as described in U.S. Pat. No. 4,042,848 and as indicated in FIG. 2. The pinch starts near the circumference of the electrodes and proceeds toward the center and the radiation spot is developed along the axis of symmetry and at the center of the inner electrode as shown in FIG. 2 at 34. Radiation can be collected and directed as described with respect to the FIG. 1 embodiment. However, it is possible to capture radiation in two directions coming out of both sides of the unit as shown in FIG. 2. Also, by locating a dielectric mirror at 38, a substantial percentage of the radiation initially reflected to the left could be reflected back through the radiation spot. This should stimulate radiation toward the right side.

Third Preferred Embodiment

Figure 3:
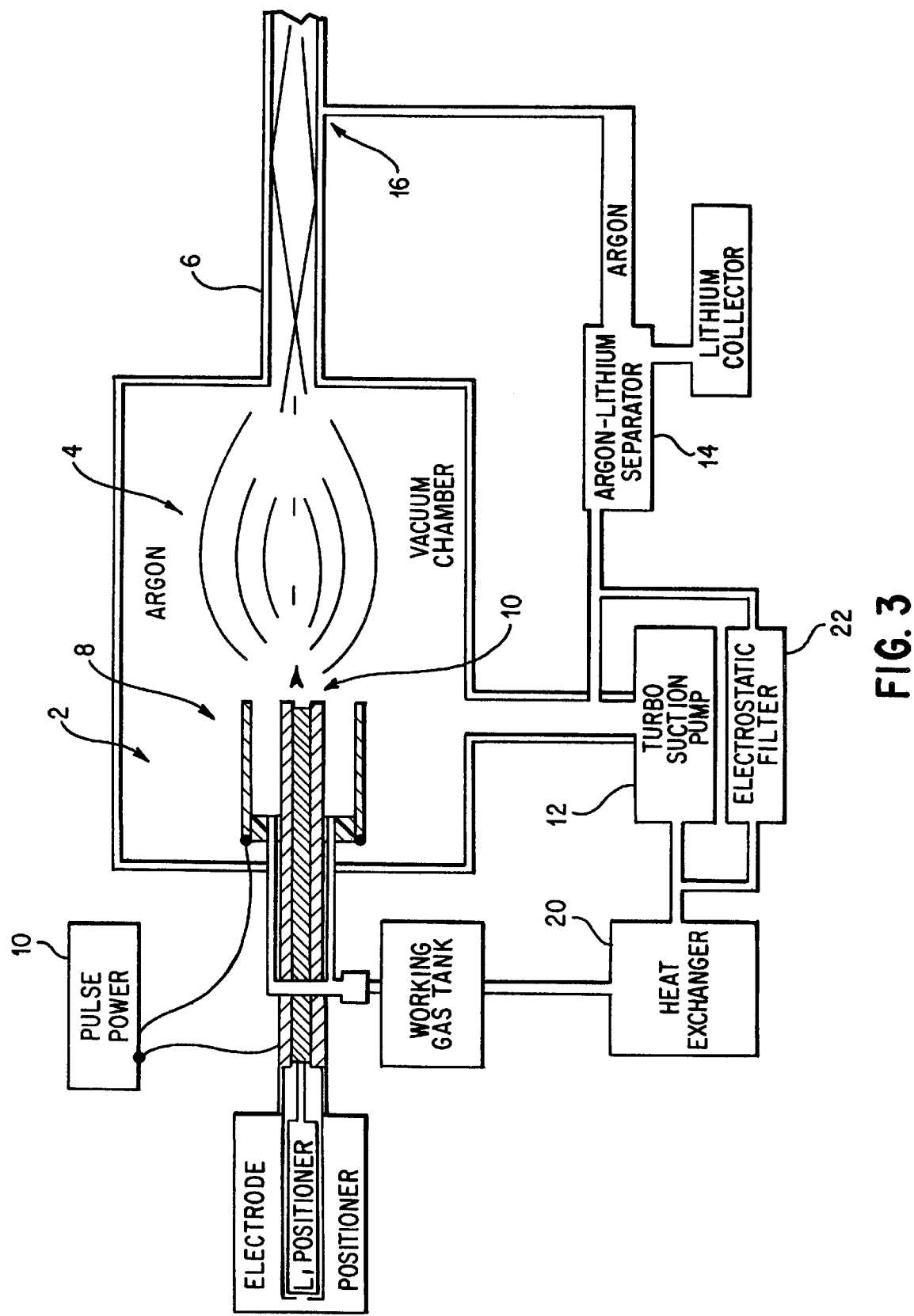
FIG. 3 is a drawing of a third preferred embodiment of the present invention.

A third preferred embodiment can be described by reference to FIG. 3. This embodiment is similar to the first preferred embodiment. In this embodiment, however, the buffer gas is argon. Helium has the desirable property that it is relatively transparent to 13 nm radiation, but it has the undesired property that it has a small atomic mass. The low atomic mass forces us to operate the system at a background pressure of 2–4 Torr. As the He pressure is increased its transmission at 13 nm decreases. An additional drawback of the small atomic mass of He is the length of electrode required to match the acceleration distance with the timing of the electrical drive circuit. Because He is light, the electrode must be longer than desired so that the He falls off the end of the electrode simultaneous with the peak of current flow through the drive circuit.

A heavier atom such as Ar will have a lower transmission than He for a given pressure, but because of its higher mass can produce a stable pinch at a lower pressure. The lower operating pressure of Ar more than offsets the increased absorption properties of Ar. Additionally, the length of the electrode required is reduced due to the higher atomic mass. A shorter electrode is advantageous for two reasons. The first is a resulting reduction in circuit inductance when using a shorter electrode. A lower inductance makes the drive circuit more efficient and thus reduces the required electrical pump energy. The second advantage of a shorter electrode is a reduction in the thermal conduction path length from the tip of the electrode to the base. The majority of the thermal energy imparted to the electrode occurs at the tip and the conductive cooling of the electrode occurs mainly at the base (radiative cooling also occurs). A shorter electrode leads to a smaller temperature drop down its length from the hot tip to the cool base. Both the smaller pump energy per pulse and the improved cooling path allow the system to operate at a higher repetition rate. Increasing the repetition rate directly increases the average optical output power of the system. Scaling the output power by increasing repetition rate, as opposed to increasing the energy per pulse, is the most desired method for the average output power of lithography light sources.

In this preferred embodiment the lithium is not injected into the chamber in gaseous form as in the first and second embodiments. Instead solid lithium is placed in a hole in the center of the central electrode as shown in FIG. 3. The heat from the electrode then brings the lithium up to its evaporation temperature. By adjusting the height of the lithium relative to the hot tip of the electrode one can control the partial pressure of lithium near the tip of the electrode. One preferred method of doing this is shown in FIG. 3. A mechanism is provided for adjusting the tip of the solid lithium rod relative to the tip of the electrode.

The hole down the center of the electrode provides another important advantage. Since the plasma pinch forms near the center of the tip of the central electrode, much of the energy is dissipated in this region. Electrode material near this point will be ablated and eventually end up of other surfaces inside the pressure vessel. Employing an electrode with a central hole greatly reduces the available erosion material. In addition, Applicant's experiments have shown that the existence of lithium vapor in this region further reduces the erosion rate of electrode material. A bellows or other appropriate sealing method should be used to maintain a good seal where the electrode equipment enters the chamber. Replacement electrodes fully loaded with the solid lithium can be easily and cheaply manufactured and easily replaced in the chamber.

Fourth Preferred Embodiment

A fourth preferred embodiment is a configuration as shown in FIG. 2 modified as described for the third preferred embodiment to utilize argon instead of helium and insert solid lithium into the chamber as a part of the central electrodes instead of using the gaseous lithium.

It is understood that the above described embodiments are illustrative of only a few of the many possible specific embodiments which can represent applications of the principals of the present invention. For example, instead of recirculating the working gas it may be preferable to merely trap the lithium and discharge the helium. Use of other electrode—coating combinations other than tungsten and silver are also possible. For example copper or platinum electrodes and coatings would be workable. Other techniques for generating the plasma pinch can be substituted for the specific embodiment described. Some of these other techniques are described in the patents referenced in the background section of this specification, and those descriptions are all incorporated by reference herein. Many methods of generating high frequency high voltage electrical pulses are available and can be utilized. An alternative would be to keep the lightpipe at room temperature and thus freeze out both the lithium and the tungsten as it attempted to travel down the length of the lightpipe. This freeze-out concept would further reduce the amount of debris which reached the optical components used in the lithography tool since the atoms would be permanently attached to the lightpipe walls upon impact. Deposition of electrode material onto the lithography tool optics can be prevented by designing the collector optic to re-image the radiation spot through a small orifice in the primary discharge chamber and use a differential pumping arrangement. Helium or argon can be supplied from the second chamber through the orifice into the first chamber. This scheme has been shown to be effective in preventing material deposition on the output windows of copper vapor lasers. Lithium hydride may be used in the place of lithium. The unit may also be operated as a static-fill system without the working gas flowing through the electrodes. Of course, a very wide range of repetition rates are possible from single pulses to about 5 pulses per second to several hundred or many thousand pulses per second. If desired, the adjustment mechanism for adjusting the position of the solid lithium could be modified so that the position of the tip of the central electrode is also adjustable to account for erosion of the tip.

Many other electrode arrangements are possible other than the ones described above. For example, the outside electrode could be cone shaped rather than cylindrical as shown with the larger diameter toward the pinch. Also, performance in some embodiments could be improved by allowing the inside electrode to pertrude beyond the end of the outside electrode. Also, an improved pulse shape may be provided by preionizing the gas between the electrodes prior to the very high voltage pulse. This could be done with spark plugs or other preionizers well known in the art. Another preferred alternative is to utilize for the outer electrode an array of rods arranged to form a generally cylindrical or conical shape. This approach helps maintain a symmetrical pinch centered along the electrode axis because of the resulting inductive ballasting.

Accordingly, the reader is requested to determine the scope of the invention by the appended claims and their legal equivalents, and not by the examples which have been given.

What is claimed is:

1. A high energy photon source comprising:
   A. a vacuum chamber,
   B. at least two electrodes located within said vacuum chamber and defining an electrical discharge region and arranged to create high frequency plasma pinches upon electrical discharge,
   C. a working gas comprising an active gas and a buffer gas, said buffer gas being a noble gas, and said active gas being chosen to provide light at least one spectral line,
   D. a working gas supply system for supplying a working gas to said discharge region,
   E. a pulse power source for providing electrical pulses and voltages high enough to create electrical discharge between said at least one pair of electrode,
   F. as external reflection radiation collector-director for collecting radiation produced in said plasma pinches and for directing said radiation in a desired direction.

2. A high energy photon source as in claim 1 wherein said pulse power source is programmable to provide electrical pulses at frequencies of at least 5 Hz.

3. A high energy photon source as in claim 1 wherein said active gas is produced by heating of a solid material.

4. A high energy photon source as in claim 3 wherein said solid material is solid lithium.

5. A high energy photon source as in claim 4 wherein said solid lithium is located in one of said two electrodes.

6. A high energy photon source as in claim 4 wherein said two electrodes are configured coaxially to define a central electrode defining an axis and a central tip and said solid lithium is positioned along said axis.

7. A high energy photon source as in claim 6 and further comprising a position adjustment means to adjust said lithium relative to said central electrode tip.

8. A high energy photon source as in claim 1 wherein said active gas is lithium vapor.

9. A high energy photon source as in claim 1 wherein said active gas is lithium hydride.

10. A high energy photon source as in claim 1 and further comprising a light pipe arranged to transmit radiation collected and directed by said collector-director.

11. A high energy photon source as in claim 1 wherein said electrodes are comprised of an electrode material and said collector-directed is coated with the same electrode material.

12. A high energy photon source as in claim 9 wherein said electrode material is tungsten.

13. A high energy photon source as in claim 11 wherein said electrode material is silver.

14. A high energy photon source as in claim 1 wherein said buffer gas is helium.

15. A high energy photon source as in claim 1 wherein said buffer gas is argon.

16. A high energy photon source as in claim 1 wherein said buffer gas is radon.

17. A high energy photon source as in claim 1 wherein said at least two electrodes are three disk shaped electrodes defining two outer electrodes and an inner electrode, said two inner electrodes during operation being at a polarity opposite said inner electrode.

18. A high energy photon source as in claim 1 wherein said two electrodes are configured coaxially to define a central electrode defining an axis and an outer electrode comprised of an array of rods.

19. A high energy photon source as in claim 18 wherein said array of rods are arranged to form in a generally cylindrical shape.

20. A high energy photon source as in claim 18 wherein said array of rods are arranged to form a generally conical shape.

* * * * *